US010005671B2

(12) United States Patent
White et al.

(10) Patent No.: US 10,005,671 B2
(45) Date of Patent: Jun. 26, 2018

(54) APPARATUS FOR SELECTIVE DEPOSITION OF NANOTUBES, USING A CHARGING ELEMENT, A TEMPLATE AND A FILTER

(71) Applicant: BRITISH TELECOMMUNICATIONS public limited company, London (GB)

(72) Inventors: Catherine White, London (GB); Jane Elizabeth Tateson, London (GB)

(73) Assignee: BRITISH TELECOMMUNICATIONS public limited company, London (GB)

( * ) Notice: Subject to any disclaimer, the term of this patent is extended or adjusted under 35 U.S.C. 154(b) by 0 days. days.

(21) Appl. No.: 14/901,808

(22) PCT Filed: Jun. 30, 2014

(86) PCT No.: PCT/GB2014/000263
§ 371 (c)(1),
(2) Date: Dec. 29, 2015

(87) PCT Pub. No.: WO2014/207430
PCT Pub. Date: Dec. 31, 2014

(65) Prior Publication Data
US 2016/0368771 A1    Dec. 22, 2016

(30) Foreign Application Priority Data
Jun. 29, 2013    (GB) .................................. 1311738.7

(51) Int. Cl.
*C01B 31/02*    (2006.01)
*B82Y 10/00*    (2011.01)
(Continued)

(52) U.S. Cl.
CPC .......... *C01B 31/0266* (2013.01); *B82Y 10/00* (2013.01); *B82Y 40/00* (2013.01);
(Continued)

(58) Field of Classification Search
None
See application file for complete search history.

(56) References Cited

U.S. PATENT DOCUMENTS 3,386,416 A * 6/1968 Wirth ..................... B05C 19/002
                                                    118/308
3,861,354 A * 1/1975 Muntz ................ G03G 15/0803
                                                    118/629
(Continued)

FOREIGN PATENT DOCUMENTS

EP    1 862 432    12/2007

OTHER PUBLICATIONS

International Search Report for PCT/GB2014/000263 dated Sep. 22, 2014, five pages.

*Primary Examiner* — Charles Capozzi
(74) *Attorney, Agent, or Firm* — Nixon & Vanderhye P.C.

(57) ABSTRACT

An apparatus according to the present invention comprises a chamber into which carbon nanotubes dispersed in a non-polar solvent may be received. The nanotubes are impelled along the chamber by the application of an external electrical field and will pass through a charging element that imposes an electrical charge on the nanotubes, and a template (180), such that the nanotubes are deposited on a substrate located next to the template. The substrate may be moved relative to the template such that the nanotubes are deposited on the substrate in a predetermined selective manner.

18 Claims, 5 Drawing Sheets

(51) Int. Cl.
  *B82Y 40/00* (2011.01)
  *C01B 32/168* (2017.01)
  *C01B 32/172* (2017.01)
  *H01L 29/41* (2006.01)

(52) U.S. Cl.
  CPC .......... *C01B 32/168* (2017.08); *C01B 32/172* (2017.08); *H01L 29/413* (2013.01); *Y10S 977/742* (2013.01); *Y10S 977/845* (2013.01); *Y10S 977/932* (2013.01)

(56) References Cited

U.S. PATENT DOCUMENTS

| | | | |
|---|---|---|---|
| 2002/0062785 A1* | 5/2002 | Kim | C23C 14/042 |
| | | | 118/504 |
| 2004/0107903 A1* | 6/2004 | Nelson | B05D 3/0486 |
| | | | 118/624 |
| 2006/0131172 A1 | 6/2006 | Kim et al. | |
| 2007/0009909 A1 | 1/2007 | Lopez et al. | |
| 2010/0018184 A1* | 1/2010 | Gilchrist | F03H 1/0012 |
| | | | 60/202 |
| 2010/0129275 A1 | 5/2010 | Jang et al. | |
| 2010/0140213 A1 | 6/2010 | Mizukami et al. | |
| 2011/0311722 A1* | 12/2011 | Faris | B82Y 20/00 |
| | | | 427/203 |
| 2012/0106024 A1 | 5/2012 | Conny | |
| 2013/0243964 A1* | 9/2013 | Ling | B05D 5/00 |
| | | | 427/475 |

* cited by examiner

APPARATUS FOR SELECTIVE DEPOSITION OF NANOTUBES, USING A CHARGING ELEMENT, A TEMPLATE AND A FILTER

This application is the U.S. national phase of International Application No. PCT/GB2014/000263 filed 30 Jun. 2014 which designated the U.S. and claims priority to GB Patent Application No. 1311738.7 filed 29 Jun. 2013, the entire contents of each of which are hereby incorporated by reference.

BACKGROUND AND SUMMARY

The present invention relates to an apparatus for processing materials, and in particular to an apparatus for processing particles with nanoscale cross-section such as carbon nanotubes in order to form circuits or devices.

Carbon exists as a number of different allotropes, for example diamond and graphite. Despite both of these materials being formed from carbon atoms they have very different physical and electrical properties. Carbon can also form allotropes having a spherical shape, known as fullerenes, or a sheet formed from a single layer of graphite molecules, called graphene. Carbon can also be processed such that it has a cylindrical nanostructure and this allotrope is called a carbon nanotube (CNT). The size of a CNT and the geometry of the carbon atoms in the CNT will determine the properties of a CNT. It has been demonstrated that carbon nanotubes can be fabricated in large quantities and with specific diameters and chirality that means that they have the properties of metallic conductors. It is thought that significant advantages in electrical and physical characteristics can be realised for wires manufactured from such CNTs. For example, it is theoretically predicted that such CNT wires will have lower resistivity than copper or silver conductors and that they will not be subject to the skin effect that is present in copper conductors, which leads to a decreased performance as the frequency of an AC current passed through them increases. In addition it has been demonstrated that CNTs can be used for data transmission. Physically, CNT wires have been demonstrated to be highly flexible and extremely strong and therefore suited to fabrication into very fine but robust structures.

Furthermore, it is believed that it may be possible to manipulate CNTs in order to fabricate simple structures, such as nanowires having very precise dimensions (for example, for use in high-frequency circuits), or more complex structures such as devices for use in electronic or photonic circuits.

There is a trend towards miniaturization of electronic circuit components which ideally requires individual macromolecules and nanoscale particles. The technical challenge lies in assembling individual nanotubes into a precise controlled configuration onto a substrate. Carbon Nanotubes are one example of a modern nanoscale material which is suitable for this application; both as interconnects and transistors. However this invention is applicable to other forms of nanotube, nanowire and nanoscale particle.

According to a first aspect of the present invention, there is provided an apparatus comprising: a chamber; an inlet for admitting particles dispersed within a fluid into the chamber; a template, configured such that, in use, particles passing through the template are selectively deposited on a substrate received adjacent to the template; a charging element, the charging element extending across the chamber and being located between the inlet and the template such that, in use, the charging element can impose an electrical charge on the particles admitted into the chamber; and a filter element, the filter element extending across the chamber and being located between the charging element and the template such that, in use, a first electrical signal is applied to the filter element such that the particles are attracted to the filter element.

The template may comprise a single or a plurality of template regions each of which is a nanopore membrane configured with a distinct pattern of pores/holes, which may be received within a frame formed from an insulating material. Furthermore, an electrical potential may be selectively applied to one or more of the plurality of template regions.

Embodiments of the present invention will now be described, by way of example only, with reference to the accompanying drawings in which:

DETAILED DESCRIPTION OF PRESENT EXAMPLE EMBODIMENTS

Figure 1:
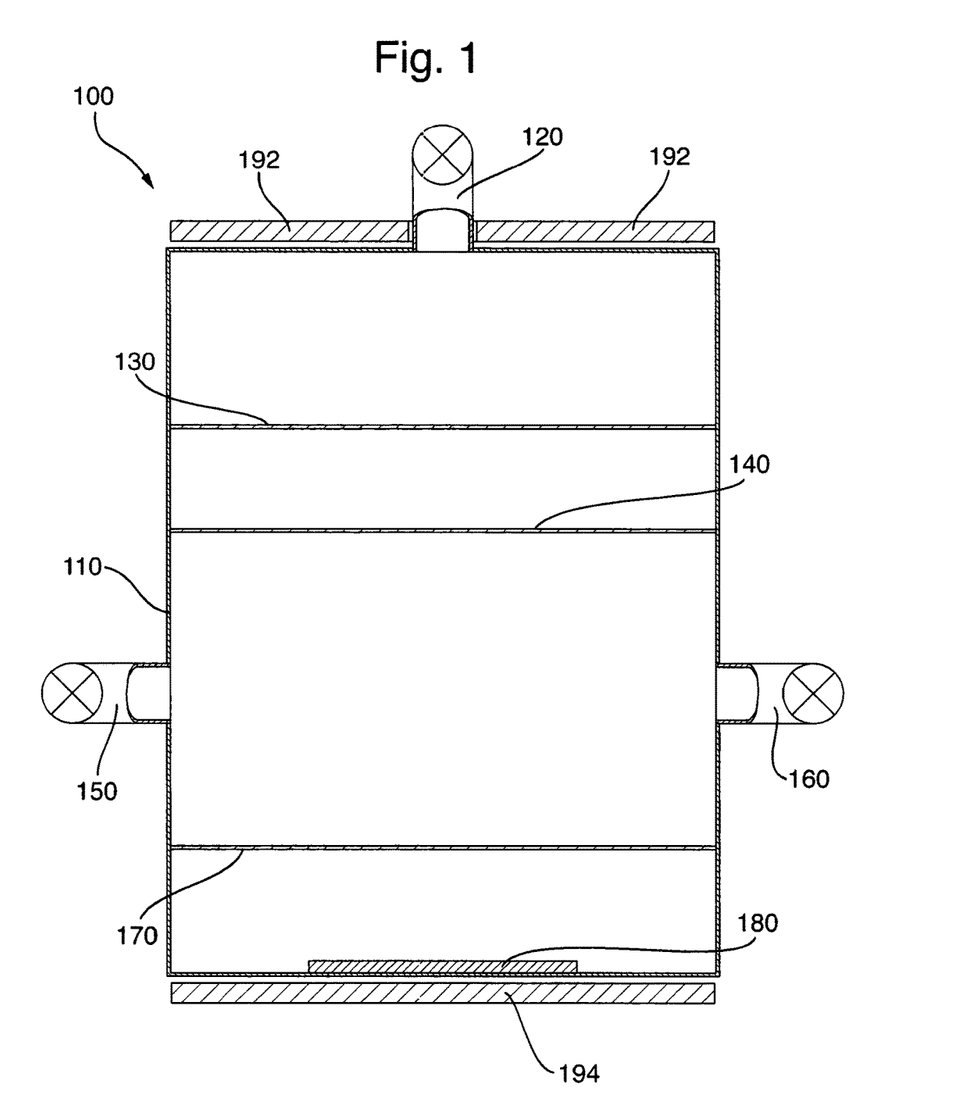
FIG. 1 shows a schematic depiction of an apparatus according to the present invention.

FIG. 1 shows a schematic depiction of a cross-section of an apparatus 100 according to the present invention, which comprises a chamber 110, valves 120, 150, & 160, charge/discharge element 130, stop-go filter 140, template membrane 170 and substrate 180. The apparatus further comprises first charging plate 192 and second charging plate 194 which are located near to and outside the chamber. The first charging plate is received around the input valve 120 and the second charging plate being located near to the substrate 180.

In operation, the chamber is filled with a fluid or gel solvent, for example via inlet valve 120, within which is dispersed a plurality of nanotubes, for example by a process such as sonication. Non-polar organic solvents, such as, for example, chloroform, may be used. Ionic or aqueous solvents may also be used, suitability to disperse the particles without reacting with them will determine the choice of solvent.

As will be seen in greater detail from the following discussion, charged permeable elements which traverse the cell are used in order to provide a number of different functional effects. For example, an element may be used to impart an electrical charge to the nanotubes: a further element may be used to control the movement of the nanotubes through the cell; and a yet further element may function as a template stage which controls the deposition of the carbon nanotubes onto the substrate.

Alternatively, non-conductive, inorganic nanopore membranes may be used for the physical template if a parallel metallic mesh (which can have larger pores) is used to produce the required electrical field. One advantage of such a composite structure is that the metallic mesh can be insulated to prevent electrical charge from being transferred to the nanotubes. In the case of the charge/discharge stage, charge transfer is a desired consequence, and thus insulation would not be used.

These elements, specifically charge/discharge element 130, stop-go filter 140 and template membrane 170, may comprise membranes formed from a layer of graphene within which an array of nanopores have been formed (for example see H Bayley, "*Nanotechnology: Holes with an edge*", Nature, 467, pp 164-165 (9 Sep. 2010) & S. Garaj et al "Graphene as a subnanometer trans-electrode membrane", Nature, 467, 190-193 (9 Sep. 2010)).

An electric field is applied to the chamber in the region proximate to the inlet valve 120, using the first and second charging plates 192, 194. The first and second charging plates may comprise a dense metallic lattice which can be formed from a conductive nanopore membrane, for example graphene.

The present invention makes use of a template membrane 170 in combination with an electric field to guide the placement of nanotubes onto a substrate 180. The template membrane contains a pattern of nanopores, through which the nanotubes can be drawn by the application of an electric field. The template is activated by controlling the electric field profile across the region. This is done both by controlling the electric field external to the cell, and by changing the electric potential in the plane of the template membrane. A conductive plane at the template (either the template membrane itself, or a parallel conductive mesh that covers the template) is connected to an external potential through the walls of the cell and can be charged or discharged, which allows the potential of the membrane to be changed. To initialise or pause the flow of nanotubes through the template membrane, the potential at the template is set to a minimum.

Figure 4A:
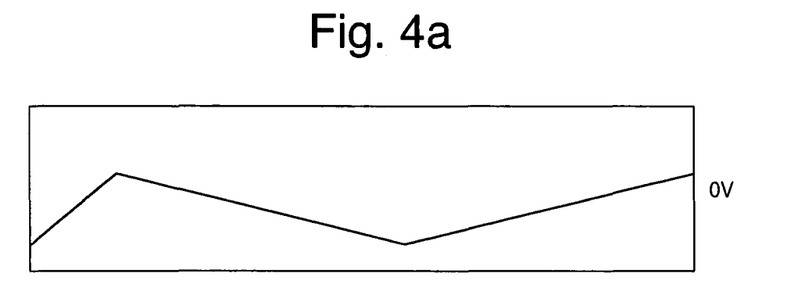
FIGS. 4a-4c show a graphical depiction of the profile of the electric potential within the chamber of the apparatus for different modes of operation.
Figure 4B:
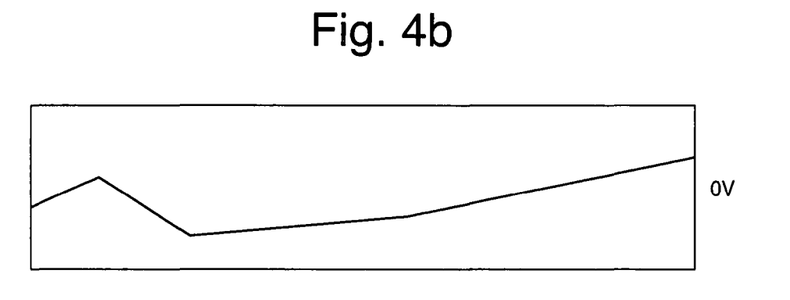
Figure 4C:
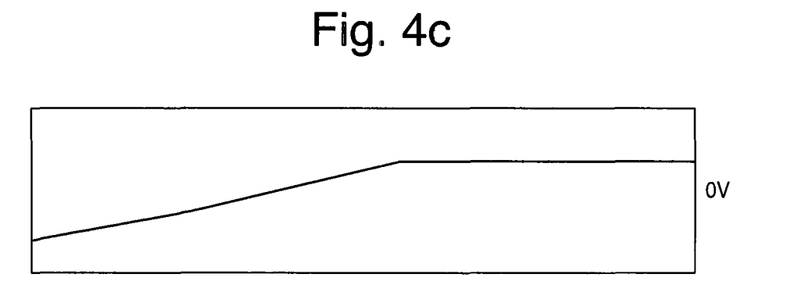

FIG. 4 shows potential profiles for nanotubes in the region of the template membrane and substrate in various modes: Initialise/Pause, Draw, Reverse/Clean.

When drawing nanotubes onto the surface of the substrate, the charge on the template is reduced, and the charge on the external plate 194 adjacent the substrate is increased. This sets the potential at the substrate to a minimum, causing the nanotubes to be attracted to and held at the substrate surface. The substrate may be moved relative to the template membrane during placement, for example using piezoelectric actuators, such that the nanotubes are deposited on the substrate in a controlled manner.

The charge/discharge element 130 has the purpose of charging the nanotubes, in order to vary their response to the electric field. Charging the nanotubes would also help to keep them separated and should reduce the possibility that the nanotubes bundle together, although the solvent will also do this.

The charge/discharge element may also be used to selectively charge different types of nanotube. The nanotubes will migrate towards the charge element 130, which extends across the full width of the chamber. The charge/discharge element comprises a material to which an electrical potential may be applied, and which can transfer charge to the nanotubes as they pass through it. By appropriate application of an electrical potential the charge/discharge element may have a different effect on conducting and semiconducting nanotubes. For example, it may be used to selectively charge only the metallic nanotubes. If the nanotubes are initially a mixture of semiconducting and metallic nanotubes then metallic nanotubes may be charged preferentially if the potential of the charging electrode is not sufficient to transfer the electrons to the conduction band of the semiconductor. Depending on the potential applied to the charge element, it may charge the nanotubes positively or negatively, or even discharge them if already charged.

The charge/discharge element 130 may comprise a grid formed from nanoscale semiconducting material, for example a fine mesh of semiconducting nanotubes stretched across the cell or supported on a porous, dielectric membrane. In an alternative, a plurality of parallel charged membranes with nanopores continuously disposed over the surface may be used. A yet further alternative is that the element may take the form of a 3 dimensional permeable grille with a large, fractal surface area. A pine tree or scaffold structure would provide a large surface area for transferring charge to the nanotubes.

The embodiment may include one or more filter stages comprising nanopore membranes. This is in addition to the final template nanopore membrane—and precedes the final stage of deposition through the nanopore template. The filters may be used to select a particular particle (for example by diameter.) The filters may be in the same cell as the template stage, or it possible to divide the system into a multistage, multicell process in which filtration may occur in other cells.

The stop-go filter 140 provides a further control point at which an electric field can be applied and the motion of the particles controlled. The filter is a nanopore membrane which is conductive or contains an electrically conductive element. The stop-go filter 140 also extends across the width of the chamber. The stop-go filter is made from a conductive material and comprises an matrix of nanopores. The membrane is connected to an electrical power supply which is external to the chamber. A charge can be applied to the membrane such that the attraction between the filter and the nanotubes is greater than the force exerted on the nanotubes by the electrical field that is applied to the interior of the chamber.

In one embodiment the pores on the stop-go nanopore membranes can be opened or closed. Mechanisms for opening and closing the pores may include the use of protein nanopores which close or open in response to the transverse electrical potential. Alternatively, two membranes may be arranged in close proximity such that they are parallel. One membrane comprises a plurality of nanopores and the second membrane can be activated in order to function as a shutter to hinder or prevent the movement of particles through the membranes. The second membrane may have essentially the same pattern of nanopores as the first membrane (such that the second membrane need only be moved a small distance to block the movement of particles but particles can pass through the membranes when the second membrane is moved back into alignment with the first membrane). Alternatively the second membrane may not comprise any nanopores such that particles only pass through the first membrane when the second membrane is withdrawn.

The stop-go membrane can be used to align the ends of the nanotubes prior to introducing them to the final placement template as follows. In the first step, the potential profile across the cell and at the stop-go membrane is adjusted such that nanotubes are attracted to the surface of the membrane. This has aligned the ends. (Pores may also be closed at this point in some embodiments). Pores are then opened (if they were closed), and the potential profile across the cell changed to draw the aligned molecules through the stop-go membrane in aligned formation. In some embodiments, the final placement template membrane may itself be a stop-go membrane and may be used to align the ends of the nanotubes prior to placement.

The stop-go membrane can be used to select the length of particles as follows. In the first step, the potential profile across the cell and at the stop-go membrane is adjusted such that nanotubes are attracted to the surface of the membrane. (Pores may also be closed at this point in some embodiments). Pores are then opened (if they were closed), and the potential profile across the cell changed for a short period of time to draw a certain length of nanotube through the membrane. The potential is then switched to the configuration which "holds" the nanotube at the membrane (by creating a net zero force on the particle, and a local minimum which attracts the particle to the membrane.) Molecules shorter than the length which was drawn through the membrane are now free within the next section of the cell. These may then flushed away by introducing clean fluid into this section using valves on the side of the cell. Opening the stop-go membrane for a further short period of time will allow molecules of the tolerated length range to be drawn into the next section of the cell by the applied electric field. Remaining nanotubes, that is those that are longer than are required, above the stop go membrane may also be flushed away using side valves if desired.

The charge generates an additional electric field, which is superposed onto the field applied by the external plates. According to the polarity of the applied potential this can be used to change the electric field profile through the cell, creating a potential minimum at the position of this membrane when it is necessary to hold the flow of nanotubes.

This allows the length of the nanotubes to be selected as follows: Firstly, the region below the stop-go filter is flushed through with solvent so that it is clean: this may be achieved by, for example, pumping clean solvent into the chamber via valve 150 and pumping the solvent comprising nanotubes out of the chamber via valve 160. The cleaning process is ended when the nanotube concentration in the solvent falls below a predetermined threshold value. The region of the chamber above the stop-go filter is filled with nanotubes by pumping further nanotubes into the chamber via the inlet valve 120. The electrical potential applied to the stop-go filter is switched to a low value, such that nanotubes are attracted to the surface of the stop-go filter. Next, a pulse is applied to the stop-go filter in order to neutralize the charge on it, and simultaneously the motile electric field across the cell is increased by applying an increased potential to the first and second charging plates 192, 194. For the duration of the pulse, the net electric field at the stop-go filter causes the nanotubes to move through the pores of the membrane, and this is referred to as the "GO" mode. When the pulse ends, the membrane returns to "STOP" mode, at a minimum of potential, and nanotubes which are still in transition through the nanopores remain trapped. Only the short nanotubes have completely transferred through the stop-go filter and longer nanotubes will be held within the stop-go filter. The length of nanotubes which pass through the stop-go filter will be determined by the duration for which the stop-go filter is switched into the "GO" mode. FIG. 4a shows a graphical depiction of the variation of the electrical potential along the length of the chamber in the "STOP" mode and FIG. 4b shows a graphical depiction of the variation of the electrical potential along the length of the chamber in the "GO" mode.

Nanotubes can be drawn through the stop-go filter by increasing the strength of the electrical field such that the force exerted by the electrical field is greater than the attraction between the nanotubes and the stop-go filter. Also, the charge applied to the stop-go filter may be decreased in order to allow the nanotubes to be drawn through the stop-go filter. By increasing the electrical field in such a manner for a short period of time stop-go filter then short nanotubes will be present in the region beyond the stop-go filter. These nanotubes can be removed from the chamber by flushing the central region of the chamber, for example by pumping clean fluid into the chamber via valve 150 and pumping the fluid containing the short nanotubes from the chamber via valve 160.

The electrical field across the chamber is then pulsed with a very short pulse, causing nanotubes of a predetermined length to be drawn into the intermediate region while longer nanotubes remain partially trapped in the membrane. The 'predetermined' length is the length which is required in order to print the particular element of the pattern/circuit which is currently being printed; for example to print a data bus which is 200 nm long onto a circuit board, it is necessary to select 200 nm nanotubes. The potential on the stop-go filter is then reduced further, so that the nanotubes still embedded in it are trapped.

A computer control unit (not shown) synchronizes the timing of the electric potentials applied to the various membranes and external charging plates, and the movement of the substrate, in order to create a sequence which will print a pattern of nanotubes onto the substrate in the desired configuration.

Figure 3:
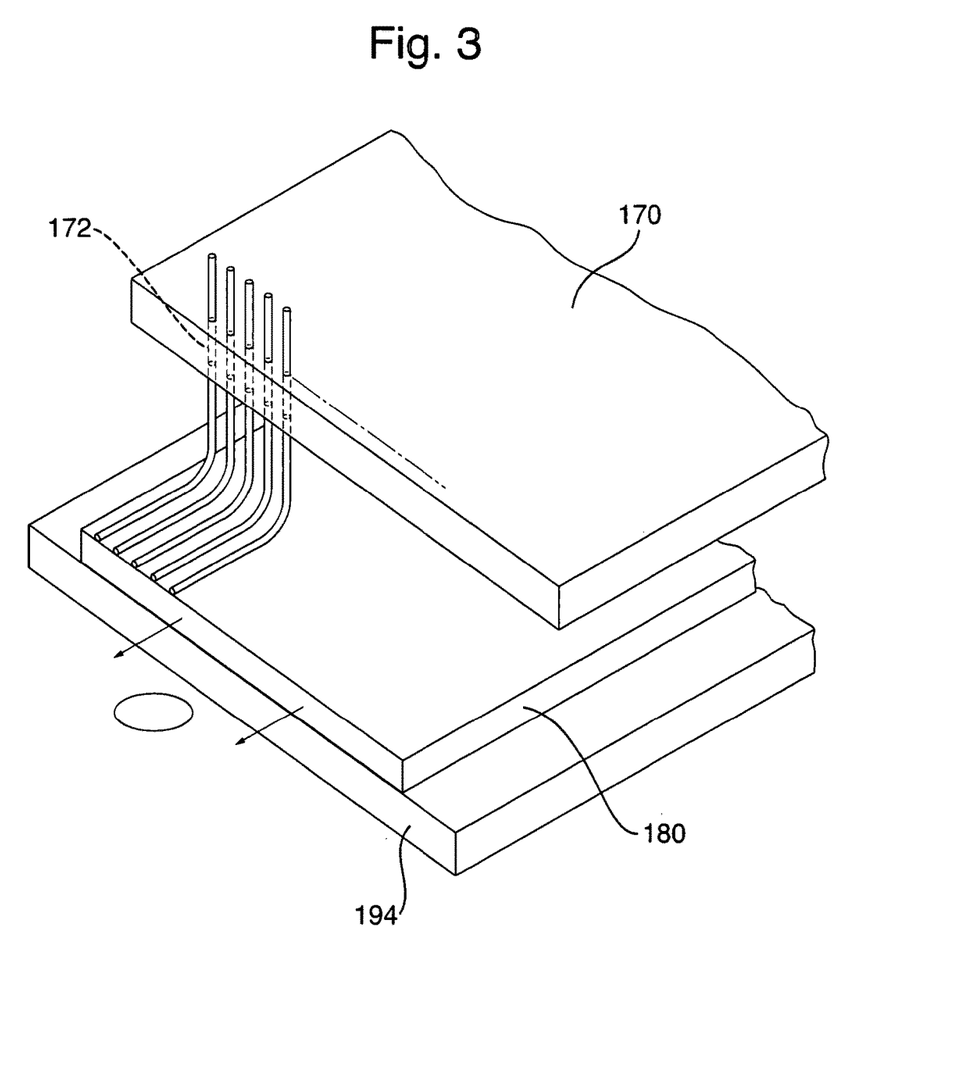
FIG. 3 is a schematic depiction of carbon nanotubes passing through a template and being deposited on a substrate.

FIG. 3 shows a depiction of nanotubes being drawn onto the substrate 180 through a template membrane 170. The template membrane comprises a plurality of nanopores 172 through which the nanotubes pass. FIG. 3 shows that the substrate is moved relative to the template such that the nanotubes are deposited in a desired pattern. The double arrows in FIG. 3 show the relative movement of the template 180. The template 180 is received on the second charging plate 194. It can be seen from FIG. 3 that by charging the nanotubes with a negative charge and applying a positive charge to the second charging plate that there is a force which attracts the nanotubes to the substrate.

The substrate may be pre-treated, for example by photolithography, in order to provide fixing points to stabilise the placement of the nanotubes. Furthermore, or in the alternative, the template may be post treated with a curing stage such as heating or laser spot welding.

An electrical charge is applied to a template 180 such that the nanotubes of a predetermined length which have passed through the stop-go filter are attracted to the template and are selectively deposited on the template. The substrate may be moved relative to the stop-go filter across a plane which is substantially parallel to the plane of the stop-go filter. Once the correct configuration of nanotubes has been deposited on the substrate, then the substrate may be removed from the chamber.

Figure 5:
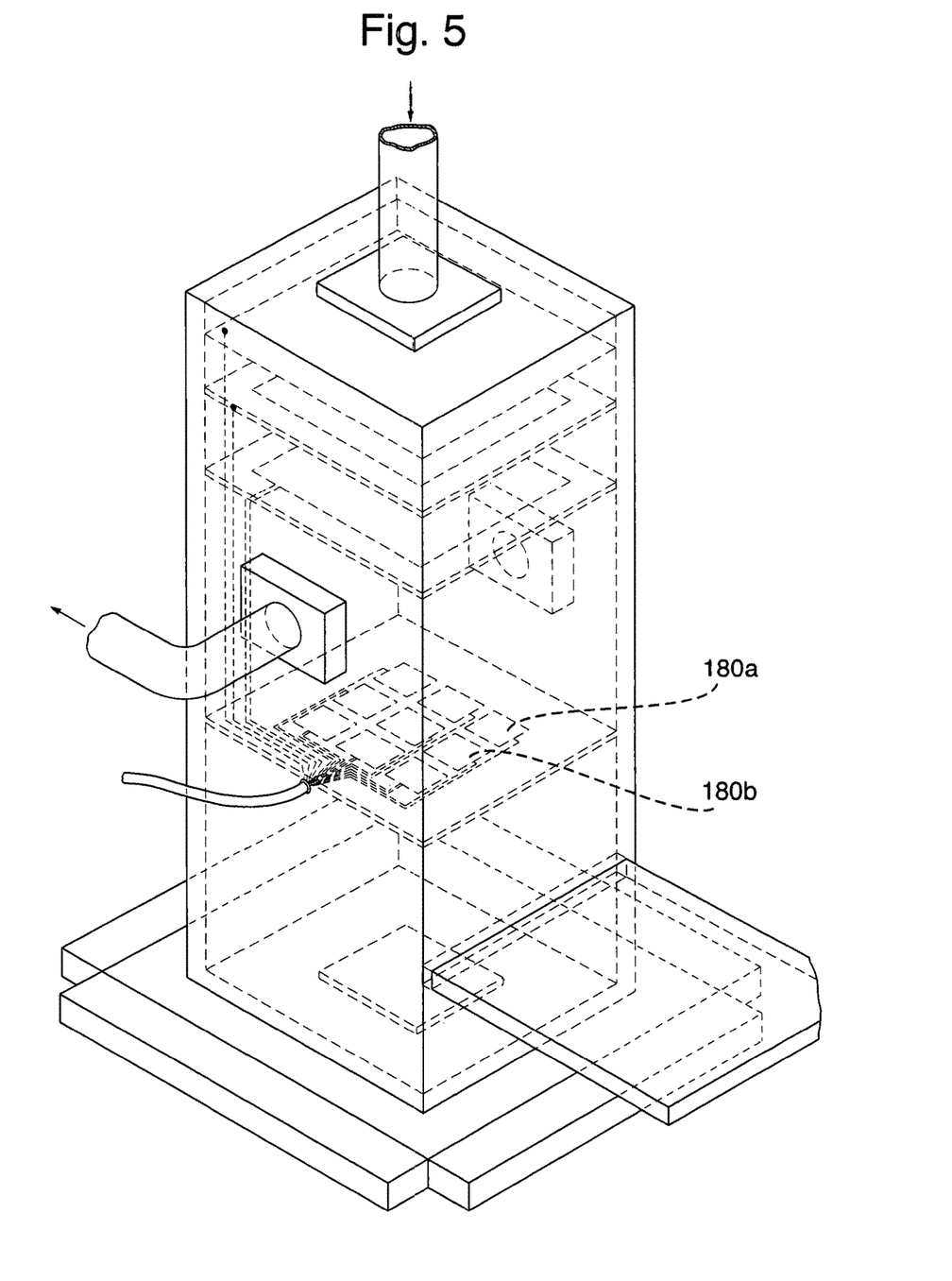
FIG. 5 is a schematic depiction of a further embodiment of an apparatus according to the present invention.

FIG. 5 is a schematic depiction of a further embodiment of an apparatus according to the present invention. FIG. 5 shows that the template 180 may comprise a frame of separate templates 180a, 180b, . . . , one or more of which can be selectively activated as each is individually connected to an external electrical source. The frame of templates may comprise a plurality of template regions received within a non-conductive frame.

Figure 2:
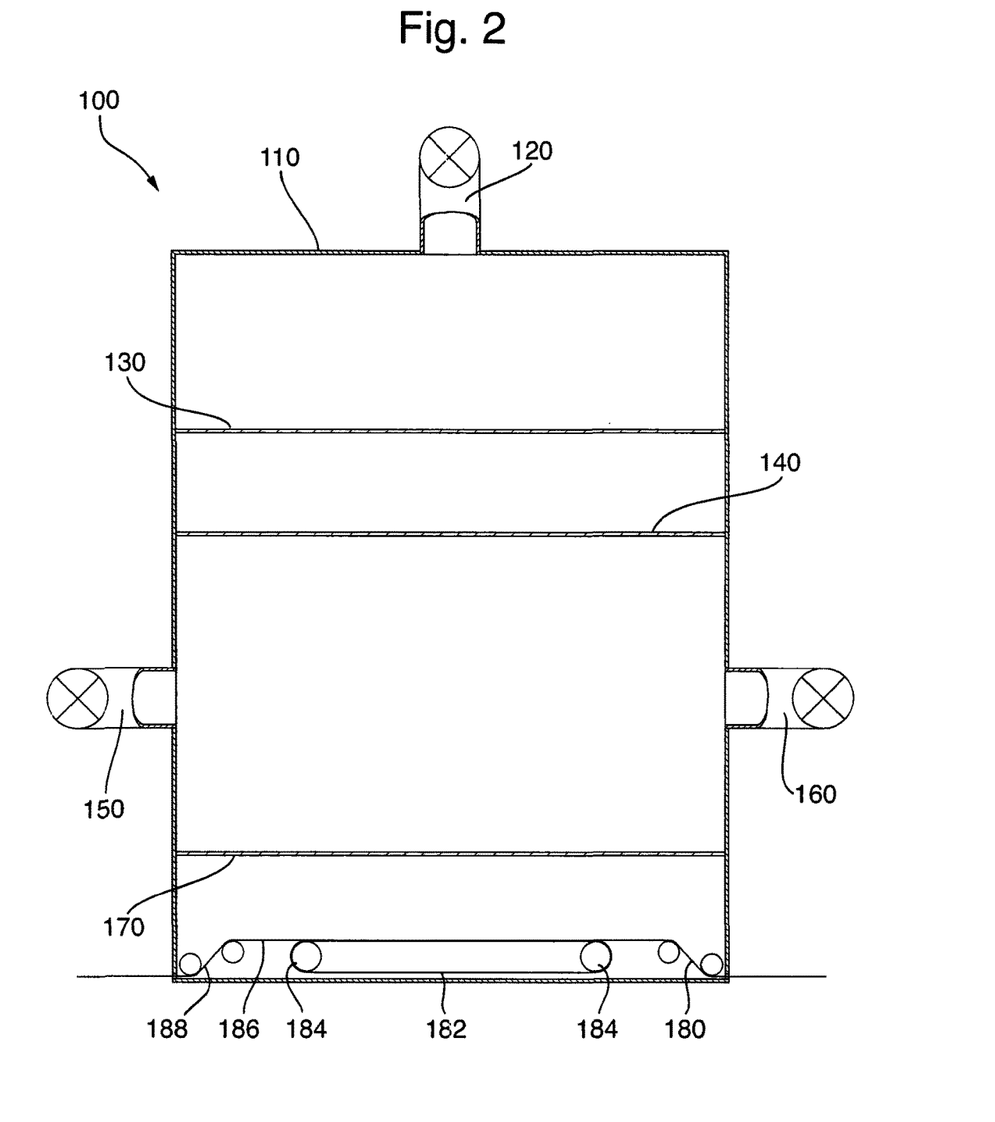
FIG. 2 shows a schematic depiction of a second embodiment of an apparatus according to the present invention.

FIG. 2 shows a schematic depiction of a cross-section of an alternative embodiment of an apparatus 100' according to the present invention. FIG. 2 shows that substrate comprises a belt 182 which is driven by a plurality of rotatable elements 194. The movement of the belt causes a laminar film to be drawn into the chamber, for example by guide rollers 188. By applying an electrical charge to a conductive structure on the belt 182 it is possible to form a continuous nanotube structure on the film. Such a structure can be used as the basis of a nanotube wire which can be used in a circuit or a cable.

The present invention may be used to form nanowires, nanotubes, that is conductors having nanoscale diameter, and even nanoparticles on an appropriate substrate. The invention is applicable to any conductor or semiconductor which can be formed in 2-dimensional lengths having a diameter in the order of 1-100 nm, and can be dispersed in a solvent. The invention could also be adapted for the placement of approximately spherical particles with diameter of the order of 1-100 nm, such as carbon buckyballs (C60).

FIGS. 1 to 5 show the chamber in a vertical orientation with the inlet valve at its highest point. The orientation of the cell is not critical to the operation of the present invention. If the chamber is orientated vertically such that the inlet is at the lowest point and the substrate is at the highest point, there is the advantage that the cell does not have to be sealed at the point of contact with the substrate. This is advantageous as it aids drawing continuous lengths of substrate through the cell, and aids removing and replacing new substrate.

If the nanotubes injected into the chamber are all of the desired length, then there is no requirement to select nanotubes on the basis of their length, and thus the stop-go filter may be omitted from the chamber.

It is also possible to omit the charging stage from the chamber. This is only the case if the nanotubes injected into the chamber solution are all of a desired type, for example either metallic or semiconducting. Also, it is necessary that there is no requirement to separate the nanotubes, that the induced polar response in the solvent is enough that the nanotubes move sufficiently under the applied electric field, and that the nanotubes are sufficiently separated and dispersed in the solvent that there is no problem of aggregation.

The embodiment may use any membrane in which pores of a nanoscale diameter can be created, including monolayer or multilayer graphene, layers of 3d crystalline material such as Silicon or Silicon Dioxide or biological lipid membrane. The embodiment may use any or all of the following three different types of charged plate/element in order to create the electric field profile across the cell.

The embodiment may also use a magnetic field applied transversely to the plane of the nanopore template membrane in order to cause the nanotubes to align at right angles to the plane of the nanopore membrane.

In one version of the present invention the nanotubes have lengths which greatly exceed the distance between the template membrane and the substrate. The nanotubes will bend as they are continuously deposited onto the substrate surface. In which case the distance between the template and the substrate surface must exceed the bending radius of the material. The bending radius is a function of the type of nanotube used (e.g. Multiwall Carbon Nanotubes are normally stiffer, and nanotubes of different diameters will have different bending radii). Therefore in this embodiment the distance of the template from the substrate may be adjustable (for example by using a mechanism which allows the template to move up and down relative to the substrate) in order to allow the particles to be deposited on the substrate. In this embodiment the template is moved continuously during deposition—for example using a carefully regulated piezoelectric mechanized platform which moves the membrane in the plane of the membrane, so that there is a continuous flow of the nanotubes onto the substrate in the intended direction of their placement. This process could for example be used to create a data bus of long, narrow, parallel nanotubes.

In one version of the present invention valves are provided to allow the chamber to be flushed with a fluid in order to clean it. This may be required to ensure particles of one type are removed from the application system before introducing a new type. The fluid maybe the solvent used to transport the particles or a different cleaning fluid may be used once the chamber has been emptied of the solvent. In some versions of the present invention, a reverse electrical potential across the whole or part of the cell may be used to reverse the direction of motion of particles, in order to clean the nanopore membranes. In some versions, this electrical potential may be rapidly cycled from forward to reverse in order to clean the membranes. In another version of the present invention the particles do not bend but have transverse length shorter than the distance between the membrane and substrate; Therefore they can be deposited without bending. In this case, the distance between the template and the substrate may also be adjustable.

The apparatus may comprise a first charging plate (external electrode) and a second charging plate, the first charging plate being located at the inlet and the second charging plate being located at or underneath the substrate. In use, the first and second charging plates may be activated such that an electrical field acts to impel the admitted particles from the inlet towards the substrate.

The profile of the electric field along the cell may be further modified by charging the elements and membranes located within the cell. The application of the electric field is such that the nanotubes will be impelled through the fluid, away from the inlet valve 120 and towards the substrate 180.

A motile force can be generated through the application of an external electric field, by mechanisms which include the creation of a surface field around each particle, the movement of a charged or inherently polarised particle in a uniform or non-uniform electric field (Electrophoresis), the induced polarisation of the particle in a non-uniform electric field (DiElectrophoresis); or, if the particle is metallic or semiconducting it may be charged by exchange of electrons with the metallic lattice—in which case the force is the response of the charge particle to the field. Optionally, the nanotubes may be electrically charged, to increase their response to the applied electric field. Charging of the nanotubes can take place using the charge/discharge element 130, which is a conductive structure with which the nanotubes will make contact as they move from the inlet valve to the substrate.

The apparatus may further comprise a charging element, the charging element extending across the chamber and being located between the inlet and the template such that, in use, the charging element can impose an electrical charge on the particles admitted into the chamber.

In one embodiment (dielectrophoresis mechanism) the apparatus may comprise other electrodes either internal or external to the cell which cause a non-uniform electric field along the length of the cell between the inlet valve and the substrate. These electrodes may not be planar, they may be curved in order to achieve the non-uniform field. This non-uniform electric field may cause the uncharged particles/nanotubes to be impelled to move through the nanopore membrane(s) in the cell towards the substrate according to the standard principle of dielectrophoresis. In this embodiment, the inclusion of a charging element to transfer charge to the nanotubes is optional.

Deposition of multilayer structures, which may require use of a curative agent such as heat or laser spot welding midway in the process. For example, a single nanotube may be deposited, then fixed by a process such as laser spot welding, then a second nanotube may be deposited on top of it at right angles. Integration of laser spot welding with the device (substrate may automatically slide out of fluidic area, or laser spot welding may take place through fluid, in place)

In summary, the present invention provides an apparatus according to the present invention comprises a chamber into which carbon nanotubes or other particles with nanoscale cross section—dispersed in a solvent may be received. The nanotubes are impelled along the chamber by the application of an external electrical field and will pass through a template such that the nanotubes are deposited on a substrate located next (but not necessarily in direct contact) to the template. The substrate may be moved relative to the template during (creating a controlled flow process) as well as in between deposition such that the nanotubes are deposited on the substrate in a predetermined selective manner.

What is claimed is:

1. An apparatus comprising:
   a chamber;
   an inlet for admitting nanoscale particles dispersed within a fluid into the chamber;
   a template membrane containing nanopores, configured such that, in use, nanoscale particles passing through the template membrane are selectively deposited on a substrate received adjacent to the template membrane;
   a charger, the charger extending across the chamber and being located between the inlet and the template membrane such that, in use, the charger is configured to impose an electrical charge on the nanoscale particles admitted into the chamber; and
   a filter element, the filter element extending across the chamber and being located between the charger and the template membrane such that, in use, a first electrical signal is applied to the filter element such that the nanoscale particles are attracted to the filter element.

2. An apparatus according to claim 1 wherein, in use, the substrate is configured to be moved relative to the template membrane.

3. An apparatus according to claim 1 wherein, in use, the nanoscale particles admitted into the chamber comprise carbon nanotubes.

4. An apparatus according to claim 1 wherein the apparatus further comprises a first charging plate and a second charging plate, the first charging plate being located at the inlet and the second charging plate being located at the substrate.

5. An apparatus according to claim 4 wherein the first and second charging plates are activated, in use, such that an electrical field acts to impel the admitted nanoscale particles from the inlet towards the substrate.

6. An apparatus according to claim 1 wherein in use, a second electrical signal is applied to the filter element such that the nanoscale particles pass through the filter element.

7. An apparatus according to claim 1 wherein the template membrane comprises a plurality of template membrane regions.

8. An apparatus according to claim 7 wherein the plurality of template membrane regions are received within a frame formed from an insulating material.

9. An apparatus according to claim 7 wherein an electrical signal may be selectively applied to one or more of the plurality of template membrane regions.

10. An apparatus according to claim 4 wherein the first charging plate and the second charging plate are located outside of the chamber.

11. An apparatus according to claim 1 wherein the inlet is arranged at a top side of the chamber.

12. An apparatus according to claim 1 wherein the charger comprises a grid formed from nanoscale semiconducting material.

13. An apparatus according to claim 1 wherein the charger comprises a plurality of parallel charged membranes with nanopores.

14. An apparatus according to claim 1 wherein the charger comprises a three dimensional permeable grille.

15. An apparatus according to claim 1 wherein the charger comprises membranes formed from a layer of graphene having nanopores.

16. An apparatus according to claim 1 wherein the charger is further configured to discharge the nanoscale particles when the nanoscale particles are already charged.

17. An apparatus comprising:
    a chamber;
    an inlet for admitting particles dispersed within a fluid into the chamber;
    a template, configured such that, in use, particles passing through the template are selectively deposited on a substrate received adjacent to the template;
    a charger, the charger extending across the chamber and being located between the inlet and the template such that, in use, the charger is configured to impose an electrical charge on the particles admitted into the chamber; and
    a filter element, the filter element extending across the chamber and being located between the charger and the template such that, in use, a first electrical signal is applied to the filter element such that the particles are attracted to the filter element;
    wherein in use, a second electrical signal is applied to the filter element such that the particles pass through the filter element.

18. An apparatus comprising:
    a chamber;
    an inlet for admitting particles dispersed within a fluid into the chamber;
    a template, configured such that, in use, particles passing through the template are selectively deposited on a substrate received adjacent to the template;
    a charger, the charger extending across the chamber and being located between the inlet and the template such that, in use, the charger is configured to impose an electrical charge on the particles admitted into the chamber; and
    a filter element, the filter element extending across the chamber and being located between the charger and the template such that, in use, a first electrical signal is applied to the filter element such that the particles are attracted to the filter element; wherein:
    the apparatus further comprises a first charging plate and a second charging plate, the first charging plate being located at the inlet and the second charging plate being located at the substrate; and
    the first charging plate and the second charging plate are located outside of the chamber.

* * * * *